(12) United States Patent
Vangeneugden et al.

(10) Patent No.: US 9,255,330 B2
(45) Date of Patent: Feb. 9, 2016

(54) METHOD AND DEVICE FOR ATMOSPHERIC PRESSURE PLASMA TREATMENT

(75) Inventors: Dirk Vangeneugden, Opgrimbie (BE); Erwin Van Hoof, Retie (BE); Robby Rego, Geel (BE)

(73) Assignee: VITO NV (BE)

(*) Notice: Subject to any disclaimer, the term of this patent is extended or adjusted under 35 U.S.C. 154(b) by 314 days.

(21) Appl. No.: 13/704,163

(22) PCT Filed: Jun. 29, 2011

(86) PCT No.: PCT/EP2011/060954
§ 371 (c)(1),
(2), (4) Date: Dec. 13, 2012

(87) PCT Pub. No.: WO2012/004175
PCT Pub. Date: Jan. 12, 2012

(65) Prior Publication Data
US 2013/0084409 A1    Apr. 4, 2013

Related U.S. Application Data

(60) Provisional application No. 61/362,729, filed on Jul. 9, 2010.

(30) Foreign Application Priority Data

Jul. 9, 2010 (EP) .................................... 10169063

(51) Int. Cl.
*H01J 37/32* (2006.01)
*C23C 16/54* (2006.01)
(Continued)

(52) U.S. Cl.
CPC ............. *C23C 16/545* (2013.01); *B29C 59/14* (2013.01); *D06M 10/025* (2013.01);
(Continued)

(58) Field of Classification Search
CPC ...... H01J 37/32559; H01J 37/32733–37/3277; H01J 37/32348; H01J 37/32376; H01J 37/32477; H05H 1/2406; H05H 2001/2412

USPC ........................................................ 118/718
See application file for complete search history.

(56) References Cited

U.S. PATENT DOCUMENTS 4,542,711 A * 9/1985 Izu et al. .................... 118/718
5,397,395 A * 3/1995 Sano et al. .................. 118/718
(Continued)

FOREIGN PATENT DOCUMENTS

JP    56005975 A  *  1/1981
JP    59219927 A  * 12/1984
(Continued)

OTHER PUBLICATIONS

International Search Report and Written Opinion of the International Searching Authority from the European Patent Office in PCT/EP2011/060954, mailed on Nov. 7, 2011 (11 pages).
(Continued)

*Primary Examiner* — Karla Moore
(74) *Attorney, Agent, or Firm* — Finnegan, Henderson, Farabow, Garrett & Dunner, LLP (57) ABSTRACT

A continuous plasma treatment process is disclosed. The process may include providing at least one plasma treatment zone having a pair of electrodes with endless dielectric belts, each belt having a first and a second side that covers one of the electrodes. The process may include producing a non-thermal plasma in a space between the belts, and transporting a web material via the belts such that there is a width of exposed belt on either side of the web material. The process may include transporting the web material such that a side of the web material not in contact with the belts is treated in two passes through the at least one plasma treatment zone, while exposed parts of the belts transporting the web material are also treated. The process may include cleaning treated parts of the belts prior to the belts re-entering the at least one plasma treatment zone.

7 Claims, 6 Drawing Sheets

(51) Int. Cl.
  *B29C 59/14* (2006.01)
  *D06M 10/02* (2006.01)
  *H05H 1/24* (2006.01)

(52) U.S. Cl.
  CPC ...... *H01J 37/3277* (2013.01); *H01J 37/32091* (2013.01); *H01J 37/32559* (2013.01); *H01J 37/32825* (2013.01); *H05H 1/2406* (2013.01); *B29C 2059/145* (2013.01); *B29C 2059/147* (2013.01); *H05H 2001/2412* (2013.01)

(56) References Cited

U.S. PATENT DOCUMENTS

| | | | |
|---|---|---|---|
| 5,472,509 A * | 12/1995 | Hiroshi | 118/723 E |
| 6,489,585 B1 * | 12/2002 | Nakamura et al. | 219/121.52 |
| 8,758,697 B2 * | 6/2014 | Thomas et al. | 422/186.05 |
| 2002/0057999 A1 | 5/2002 | Cocolios et al. | |
| 2003/0113479 A1 | 6/2003 | Fukuda et al. | |
| 2004/0045806 A1 | 3/2004 | Neff et al. | |
| 2004/0050685 A1 | 3/2004 | Yara et al. | |
| 2004/0187783 A1 * | 9/2004 | Maeda et al. | 118/718 |
| 2007/0202270 A1 | 8/2007 | Rose et al. | |
| 2009/0120782 A1 | 5/2009 | Hammen et al. | |

FOREIGN PATENT DOCUMENTS

| | | | |
|---|---|---|---|
| JP | 2001/279457 A | | 10/2001 |
| JP | 2002339075 A | * | 11/2002 |
| JP | 2003168593 A | * | 6/2003 |
| JP | 2003171770 A | * | 6/2003 |
| JP | 2007-073333 A | | 3/2007 |
| JP | 2007-332426 A | | 12/2007 |
| JP | 2009046710 A | * | 3/2009 |
| WO | WO 2004/028220 A1 | | 4/2004 |
| WO | WO 2005/095007 A1 | | 10/2005 |
| WO | WO 2006/081637 A1 | | 8/2006 |
| WO | WO 2006/116828 A1 | | 11/2006 |
| WO | WO 2007/053916 A1 | | 5/2007 |
| WO | WO 2007089146 A1 | * | 8/2007 |
| WO | WO 2008/065861 A1 | | 6/2008 |
| WO | WO 2008/119823 A1 | | 10/2008 |
| WO | WO 2009/104579 A1 | | 8/2009 |

OTHER PUBLICATIONS

Written Opinion of the International Preliminary Examing Authority from the European Patent Office in PCT/EP2011/060954, mailed on Jun. 20, 2012 (7 pages).

D. Vangeneugden et al., In-Line Atmospheric Plasma Processing using Nano-Sized Aerosols, Proceedings of the 10$^{th}$ Asian Textile Conference ~ATC-10~, Sep. 2009, Ueda, Japan, 5 pages.

* cited by examiner

METHOD AND DEVICE FOR ATMOSPHERIC PRESSURE PLASMA TREATMENT

This application is a national stage filing under 35 U.S.C. §371 of International Application No. PCT/EP2011/060954 filed on Jun. 29, 2011, which claims priority to U.S. Provisional Application No. 61/362,729, filed on Jul. 9, 2010 and European Application No. 10169063.4, filed on Jul. 9, 2010, all of which are incorporated herein by reference.

TECHNICAL FIELD OF THE INVENTION

The present invention relates to a method for plasma treatment of a web or film material at or near atmospheric pressure and an apparatus therefore.

BACKGROUND OF THE INVENTION

In many applications the mechanical, chemical or physical properties of surfaces of materials are important. If such surface properties are not provided by the bulk properties of the material, the application of coatings and surface modification are convenient ways of improving surface properties such as hardness, chemical resistance, electrical resistivity, barrier properties and optical appearance. Conventionally, the application of such coatings or surface modification is often performed at reduced pressures using methods such as sputtering, vacuum deposition or ion plating. However, the realisation of continuous production of such coatings or surface modification is difficult to realise at reduced pressure. Atmospheric plasma treatment processes have been proposed to overcome these problems in which a layer with the required physical and/or chemical property is formed on the surface of a substrate with a uniform composition or the surface itself of a substrate is modified.

U.S. 2002/0057999A1 discloses an installation in which an operation is performed that requires control over the atmosphere inside a chamber (3), the operation being performed in the presence of a gaseous mixture capable of giving off emissions, characterized in that it comprises: inlet and outlet devices (5, 8) adjoining the chamber to oppose respectively the ingress of air into the chamber and the exit of gaseous emissions therefrom; an extraction device (4) comprising a duct opening into the chamber; and means (42) for regulating the flow rate of gas drawn out by said extraction device so as to maintain an approximately zero pressure difference between the inside of the chamber and the surrounding atmosphere.

U.S. 2003/0113479A1 discloses an atmospheric pressure plasma treatment apparatus comprising a first electrode and a second electrode opposed to each other in which a discharge space is formed between the opposed electrodes, a voltage application device for applying voltage across the discharge space, a gas supply device for supplying a reactive gas and an inert gas to the discharge space, wherein the reactive gas at the discharge space is excited at atmospheric pressure or at approximately atmospheric pressure by applying voltage through the voltage application device to generate discharge plasma, and a substrate is exposed to the discharge plasma to be subjected to surface treatment, and wherein the reactive gas is not directly in contact with the discharge surface of the first electrode or the second electrode.

U.S. 2004/0050685A1 discloses a method for plasma treatment under atmospheric pressure for treating an article to be treated comprising: providing a solid dielectric on at least one opposing face of a pair of opposing electrodes under pressure near the atmospheric pressure; introducing a treatment gas between said a pair of opposing electrodes; generating plasma by applying an electric field between said electrodes; and contacting the plasma with the article to be treated, wherein an used gas is exhausted from the vicinity of treatment section where said plasma and said body to be treated are in contact, and said vicinity of treatment section is maintained under a specified gas atmosphere by a gas atmosphere control mechanism.

U.S. 2004/0050685A1 further discloses an equipment for plasma treatment under the atmospheric pressure comprising: a pair of opposing electrodes with a solid dielectric being provided on at least one opposing face thereof; a mechanism for introducing a treatment gas between said pair of opposing electrodes; a mechanism for applying an electric field between said electrodes; a mechanism for contacting the plasma obtained by said electric field with said article to be treated; a mechanism for exhausting an used gas; and a mechanism for maintaining the vicinity of treatment section, where said plasma and said article to be treated are in contact, under the specified gas atmosphere.

WO 2004/028220A1 discloses a method for generating and maintaining a plasma according to the Dielectric Barrier Discharge (DBD) technique, said method comprising the steps of: introducing a sample in the space between two electrodes, a mixed atmosphere being present between said electrodes, applying an alternating voltage to said electrodes for generating and maintaining a plasma in the volumetric space between the electrodes preferably at a pressure in the range between 100 Pa and 1 MPa, said voltage having a profile as a function of time, defined by a sequence of time periods during which a positive or zero voltage is applied, alternated with time periods during which a negative or zero voltage is applied, characterized in that said profile is asymmetrical with respect to amplitude and/or time.

WO 2005/098007A1 discloses a method for coating a substrate with an inorganic-organic hybrid polymer material using the Dielectric Barrier Discharge (DBD) technique, said method comprising the steps of: a) introducing a sample in the space between two electrodes, b) controlling the atmosphere between the electrodes, c) generating a plasma discharge between the electrodes, d) mixing aerosols containing hybrid organic/inorganic cross-linked pre-polymers formed via sol-gel processing, into the plasma discharge.

WO 2006/081637A1 discloses a plasma jet apparatus for performing plasma processing of an article, comprising: an elongated central electrode, an elongated cylindrical outer electrode surrounding said central electrode and being coaxial with said central electrode, an electrical insulator coaxially disposed between said outer electrode and said central electrode, wherein a discharge lumen having a distal end and a proximal end is defined between said central electrode and said electrical insulator, a supply opening disposed at said distal end of said discharge lumen for supplying a plasma producing gas to said discharge lumen, a power source for providing a voltage between said central electrode and said outer electrode characterised in that said electrical insulator extends in a radially placed ring at said proximal end beyond the outer surface of said outer electrode.

WO 2006/116828A1 discloses an apparatus for disinfection and purification of a medium comprising a liquid, gaseous or solid phase, or a mixture thereof, said apparatus comprising: a central electrode, a dielectric layer adjacent to said electrode, a first area adjacent to said dielectric layer, and means to introduce a first medium into said first area, a second area adjacent to said first area, and means to introduce a second medium into said second area, a means for creating a plasma in said first medium, while said first medium is present in the first area, by applying a voltage between said first electrode and a second electrode, a means for injecting said plasma into the second area, in order to be mixed with the second medium.

U.S. 2007/0202270A1 further discloses a method for coating a substrate with an inorganic-organic hybrid polymer material using the Dielectric Barrier Discharge (DBD) technique, said method comprising the steps of: a) introducing a sample in the space between two electrodes, b) controlling the atmosphere between the electrodes, c) generating a plasma discharge between the electrodes, d) mixing aerosols containing hybrid organic/inorganic cross-linked pre-polymers formed via sol-gel processing, into the plasma discharge.

WO 2007/053916A1 discloses a method for producing a coating comprising a conjugated polymer on a substrate, comprising the steps of: providing a substrate, introducing a conjugated polymer coating forming material into an atmospheric pressure plasma discharge, or into the reactive gas stream resulting therefrom, simultaneously with the introduction of a coating forming material, introducing an additional material into said plasma discharge or the reactive gas stream resulting therefrom, exposing the substrate to said plasma discharge or the reactive gas stream resulting therefrom, thereby obtaining said coating.

WO 2008/119823A1 discloses a method of coating a substrate, said method comprising the steps of: providing a substrate, producing an atmospheric pressure plasma discharge in the presence or a gas, at least partially exposing the substrate to said atmospheric pressure plasma discharge, introducing a liquid aerosol of coating forming material into said atmospheric pressure plasma discharge, thereby forming a coating on the substrate, curing the substrate and the coating, by exposing the substrate to ultraviolet light.

D. Vangeneugden et al. in the "Proceedings of the 10th Asian Textile Conference—ATC-10- Sep. 7-9, 2009 at Ueda, Japan" reported that low temperature atmospheric pressure plasma by means of dielectric barrier discharges (DBD) constitutes an emerging technology for surface pre-treatment and coating and extended the variety of chemical precursors used in DBD deposition processes from gases and liquids with high vapour pressures and/or high stability to include nano-sized aerosols.

U.S. 2009/0120782A1 discloses a surface treater, comprising: a support for supporting a material passing through the treater; an active electrode having a discharge surface disposed opposite the support; a roller disposed proximate to the active electrode to define a discharge chamber between the support and the roller in which the discharge surface of the active electrode is disposed; and a high voltage power supply operatively connected to the active electrode to ionize a process gas and produce a discharge within the discharge chamber, wherein the roller sealingly engages the material to confine the discharge chamber. U.S. 2009/0120782A1 also discloses a process for surface treatment of continuous web materials, the process comprising: supporting a web material on a support; creating a discharge chamber between the support and at least one roller; disposing a discharge surface of an active electrode within the discharge chamber; passing the web material into the discharge chamber; confining the discharge chamber at the interface with the web material by contacting the web with the at least one roller; energizing the active electrode with high voltage to ionize process gas within the discharge chamber to create a discharge through which the web material passes.

JP 2001-279457A discloses a continuous surface treating method of a continuous film deposition method using atmospheric pressure plasma for performing discharge plasma treating under a pressure under an almost atmospheric pressure in a gaseous mixture atmosphere, wherein electrodes provided with opposed each other at a predetermined discharge interval supply a gaseous mixture between roll-shaped discharge plasma treating electrodes to perform the discharge plasma treating. The substrate is a film. JP 2001-279457A in FIG. 1 discloses the simultaneous roll to roll coating of two films moving in the same direction between two roll-shaped discharge plasma electrodes with the discharge in the space between the two continuous films.

JP 2007-073333A discloses a plasma discharge treatment apparatus, comprising: a pair of electrodes; gas supplying means supplying at least a discharge gas to a facing region of the electrodes; a high frequency power supply supplying high-frequency electricity to at least one of the electrodes and generating plasma discharge in the facing region of the electrodes; and substrate belt conveying means conveying a substrate belt to the facing region of the electrodes, wherein the apparatus includes an electrode moving means which moves at least one of the electrodes in parallel in a direction perpendicular to a conveying direction of the substrate belt with respect to the other electrode. JP 2007-073333A in FIG. 1 discloses the continuous roll to roll coating of a single film in two passes between two roll-shaped discharge plasma electrodes with the discharge in the space between the continuous film as it passes through in opposite directions.

JP 2007-332426A discloses a film deposition method characterized in that it comprises the plasma generation operation wherein the outer circumferential surface of a rotary electrode having cylindrical outer circumferential surface is arranged to face the surface of the base material made from an insulating material by keeping a space or, the said outer circumferential surface is arranged to face the counter component by keeping a space and generating plasma in the space, and the operation of conveying the said base material in the direction almost perpendicular to the direction of rotation of the axis of the said rotary electrode in the vicinity of the plasma formation region and, operation of supplying gas wherein the gas in the vicinity of the outer circumferential surface of the said rotary electrode is supplied to the said plasma generation region by dragging-in the gas by rotating the said rotary electrode around the axis at the centre of the outer circumferential surface to induce chemical reaction in the said gas by means of the energy of the plasma, to form a film on the surface of the said base material. Moreover, in the said plasma generation operation, the plasma is generated in a region situated at a position shifted to the upstream side in the direction of rotation of the rotary electrode with respect to the said position of said minimum space. Furthermore, JP 2007-332426A in FIG. 3 shows an almost flat electrode as a counter electrode in place of the earthed roller for conveyance, the electrode conveyor belt. The electrode that serves as counter electrode of the rotary electrode has a flat electrode plate which is almost parallel to the said base material and is situated on the back side of the conveyor belt made from an insulator-like rubber and acting as the means of transport of the base material.

WO 2009/104579A1 discloses a plasma discharge device comprising opposing electrodes consisting of a pair of rotating roll electrodes, a plasma discharge space wherein a voltage is applied between the opposing electrodes to generate a plasma discharge, a substrate that passes through the plasma discharge space while being held by said opposing electrodes that consist of roll electrodes, and a process gas supply means that supplies process gas into said plasma discharge space, wherein said process gas is composed of a discharge gas and a thin film-forming gas, said discharge gas containing at least 90 vol % or more of nitrogen gas, and the ratio of the diameters of the above pair of roll electrodes that constitute said opposing electrodes is 1.00:0.55 to 1.00:0.95. WO 2009/104579A1 further discloses that the substrate is preferably transported consecutively using a loop transportation method to form a functional film on said base material. The loop is formed by the substrate film itself. WO 2009/104579A1 in FIGS. 1, 3, 7, 10 and 11 discloses the continuous roll to roll coating of a single film in two passes between two roll-shaped discharge plasma electrodes with the discharge in the space between the continuous film as it passes through in opposite directions. WO 2009/104579A1 in FIGS. 5 and 8 discloses the forming of a film on a single endless loop in two passes in opposite directions between two roll-shaped discharge plasma electrodes with the discharge in the space between endless loop as it passes in opposite directions between the electrodes. WO 2009/104579A1 in FIG. 6 discloses the transport of endless loops round each of two roll-shaped discharge plasma electrodes each moving in opposite directions with the discharge in the space between the two endless loops as they pass between the electrodes with a film being formed simultaneously on different substrates. However, WO 2009/104579A fails to disclose the continuous coating of a web material transported by endless dielectric belts.

WO 2008/065861A discloses an atmospheric plasma processing apparatus capable of forming a thin film having high uniformity on a cylindrical substrate stably and with high productivity. The atmospheric plasma processing apparatus has at least two substrate carrying units each holding the cylindrical substrate by a roll electrode and a guide roll and disposed at positions opposing each other. A gas containing a thin film forming gas is supplied to a discharge space formed between the opposing roll electrodes under an atmospheric pressure or a pressure near the atmospheric pressure, and a high-frequency electric field is applied to the discharge space, thereby exciting the gas. At least the two cylindrical substrates are exposed to the excited gas, so that thin films are simultaneously formed. These 'cylindrical" substrates 175 are in fact an endless substrate forming a cylindrical surface by spanning round the roll electrode 20a and the driven roller 201 (see paragraph [0020]), Paragraphs [0112] and [0113] are silent in respect of the cleaning of the substrate. WO 2008/065861A fails to disclose the continuous coating of a web material transported by endless dielectric belts.

U.S. 2004/045806A1 discloses a method for treating the surface of objects, in particular made of strip material or of deep-drawn material, in which the to-be-treated surface (2) of the object (1) is subjected in a discharge region (3) filled with a first gas or gas mixture to a barrier discharge generated between a first planar electrode (4) and a second planar electrode (5), wherein a plasma-excited second gas or gas mixture emitting UV radiation to which said to-be-treated surface (2) is additionally subjected is provided as said second electrode (5). U.S. 2004/045806A fails to disclose the continuous coating of a web material transported by endless dielectric belts.

Plasma treatment at or near atmospheric pressure involving one or more roll electrodes has the advantage of precise parallelism of the gap between the electrodes, but the disadvantage of a very short coating zone due to the shape of the roll electrodes. Moreover, inhomogeneous treatments may be produced in the case of two pass-coating, if the passes are in opposite directions.

SUMMARY OF THE INVENTION

It is an object of the present invention to provide an alternative continuous plasma treatment process and apparatus at or near atmospheric pressure. It is an advantage of embodiments of the present invention that the method or apparatus provides substantially higher treatment speeds than conventional atmospheric plasma treatment processes.

The above object is accomplished by a process and apparatus according to the present invention. The continuous non-thermal plasma treatment process e.g. a dielectric barrier discharge (DBD) plasma treatment process at a pressure of 100 Pa to 1 MPa according to embodiments of the present invention, utilises one or more pairs of electrodes capable of treating full widths of web materials and can be elongated or roller electrodes, e.g. have the form of planar or curved plates or grids, bars, cylinders, and are preferably two substantially parallel plate electrodes, but can differ in type, number and configuration and can include additional features such as electrode cooling or heating arrangements. The process can further provide two dielectric belts, preferably endless seamless belts, in contact with said electrodes thereby providing dielectric material between the electrodes and the plasma realised between the electrodes. These two dielectric belts can also provide the support for a material thereon e.g. a continuous film which is treated by the non-thermal plasma e.g. DBD plasma in the space between the two dielectric belts in two passes either in the same direction or in opposite directions through the plasma zone. The dielectric belts can be sufficiently wide to prevent products of the non-thermal plasma e.g. DBD plasma realised between dielectric belts contaminating the space containing the substantially parallel plate electrodes. The belts can be sufficiently long so that they can be continuously cleaned outside the plasma treatment zone. The electrodes can be metal electrodes or metal electrodes provided with a dielectric material such as a polymeric layer or a glass layer e.g. by coating, printing or lamination. The choice of materials for the electrodes and the dielectric belts should preferably be such as to enable the smooth transport of the dielectric belts over the electrodes.

A first aspect of the present invention realises a continuous plasma treatment process, said process comprising the steps of: providing a non-thermal plasma treatment apparatus, said apparatus comprising at least one plasma treatment zone, said plasma treatment zone comprising a pair of electrodes with endless dielectric belts each having a first and a second side and each covering an electrode of said pair of electrodes; producing a non-thermal plasma, e.g. a dielectric barrier discharge plasma, in a process gas at a pressure of 100 Pa to 1 MPa in the space between said pair of endless dielectric belt-covered electrodes by applying a voltage, such as a high voltage, between said electrode pair; providing a web material to be treated such that it can be transported by said two endless dielectric belts in such a way that there is an area in the plane of said belt at least about 5 mm on either side of said web material (preferably excluding that part of the dielectric belts covered by said web material) on the side of said endless dielectric belts with no part thereof facing one electrode of said pair of electrodes; transporting said web material using said endless dielectric belts in frictional contact with said electrodes such that the side of said web material not in contact with said endless dielectric belts is treated in two passes through said at least one plasma treatment zone while at the same time the exposed parts of the endless dielectric belts transporting said web material are also treated; and cleaning said parts of said endless dielectric belts treated with said plasma using a cleaning station outside said plasma treatment zone prior to said endless dielectric belts re-entering said plasma treatment zone, wherein said electrodes have a length in the transport direction of said endless dielectric belts of at least 10 mm, with a length of 70 to 150 mm being preferred.

A second aspect of the present invention realises an apparatus comprising at least one plasma treatment zone, said plasma treatment zone comprising a pair of electrodes with endless dielectric belts each having a first and a second side and each covering an electrode of said pair of electrodes; a voltage power supply for each plasma treatment zone connected to said pair of electrodes such that a non-thermal plasma, e.g. a dielectric barrier discharge plasma, can be produced upon applying a voltage, e.g. a high voltage, to said electrode pairs in a process gas in the space between each pair of endless dielectric belt-covered electrodes; each of said electrodes in said plasma treatment zone having a discharge surface and said discharge surface being in contact with a first side of said endless dielectric belts thereby shielding said discharge surfaces and the respective sides of the endless dielectric belts in contact with said electrodes from products of said non-thermal plasma; a means of transporting a web material to be treated comprising said endless dielectric belts; a process gas supply; rollers for driving/guiding said endless dielectric belts; and a cleaning station capable of cleaning products of said plasma treatment on the second sides of said endless dielectric belts therefrom.

An advantage of the present invention is that a continuous plasma treatment process at or near atmospheric pressure is with a plasma treatment zone at least a factor of five longer than with prior art processes providing a more homogeneous plasma discharge zone and more homogeneous treatment.

A further advantage of the present process is the provision of a continuous plasma treatment process at or near atmospheric pressure providing more homogeneous treatments due to the more homogeneous plasma treatment zone and reduced contamination of the electrodes.

A still further advantage of the present process is the provision of a continuous plasma treatment process at or near atmospheric pressure with reduced contamination of the electrodes, or of their dielectric coatings or covering dielectric layers.

A still further advantage of the present process is the provision of a high speed continuous plasma treatment process at or near atmospheric pressure in which the risk of damaging the back side of the film web material (provided web material) is significantly reduced.

A still further advantage of the present process is the provision of a high speed continuous plasma treatment process at or near atmospheric pressure in which the risk of uncontrolled plasma treatment of the back side of the film surface is significantly reduced.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

A series of illustrative and non-limiting figures is presented in which preferred embodiments of the present invention are illustrated. The main components are as follows.

(1)=web material
(2) (102), (202), (3), (103) and (203)=electrodes
(4), (104), (204), (5), (105), (205), (6), (106), (206), (7), (107), (207)=guiding rolls for both dielectric belt (directly) and web material (indirectly).
(8), (9) and (10), (34), (35), (135), (36), (136), (37), (38)=web material guiding rollers
(11), (111) and (211)=dispenser
(12) and (13)=supply tubes for the plasma ingredients
(14), (114), (214)=discharge chamber
(15)=outlet of plasma ingredients (exhaust tube)
(16) to (19)=web material guiding rollers and discharge chamber confining rollers
(20), (21) and (22)=discharge chamber confining seal
(23), (24)=web turning bar and roller system
(25) (125), (225), (26), (126), (226)=electrode dielectric layers
(27)=High Voltage Source
(28), (128), (228), (29), (129), (229)=dielectric belt guiding rollers
(30), (130), (230), (31), (131), (231)=(endless) dielectric belt
(32), (33)=gas knife

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

Definitions

Non-thermal plasma is a recognised instrument for surface treatment of different materials, such as e.g. films, fabrics, paper, etc. In a non-thermal plasma (NTP), also known as "a cold plasma", a processing gas within NIP zones changes to a plasma state in the sense that electrons are liberated from the atoms and molecules of the processing gas. However, the liberation of the electrons is not obtained because of the application of thousands of degrees Celsius; it is rather a high voltage, medium frequency, wave shaped electrical field that frees the electrons, the latter without forming a high temperature electric arc. Once the electrical field is removed, the electrons settle back into almost the same thermal state they were prior to the electrical excitation. The atoms and molecules of the processing gas typically attain temperatures in the range of 25 to 400° C., preferably 25 to 200° C., whereas the electrons have temperatures of thousands of degree Celsius. Non-thermal plasmas are hence also known as non-equilibrium plasma's due to the discrepancy in temperature in the processing gas between the temperature of the atoms and molecules, on the one hand, and the temperature of the electrons, on the other. When a surface to be treated is brought into contact with ionized processing gas, plasma-chemical reactions occur causing the surface to be treated in some respect e.g. reduced, oxidized or coated so as to obtain new properties. In operation, the main task of non-thermal plasma technology is the generation of chemically active species, such as e.g. radicals, ions or photons, that will react with a surface in a proper way. At atmospheric pressure, the lifetime of most active species is very short. It is therefore necessary either to provide a fast transfer of active species from the plasma region to the surface, or to produce active species immediately at the surface. One of both of these ideas is used in one form or another in all known approaches for the generation of non-thermal plasma at atmospheric pressure. Dielectric Barrier Discharge (DBD) treatment is an embodiment of non-thermal plasma treatment.

Figure 3:
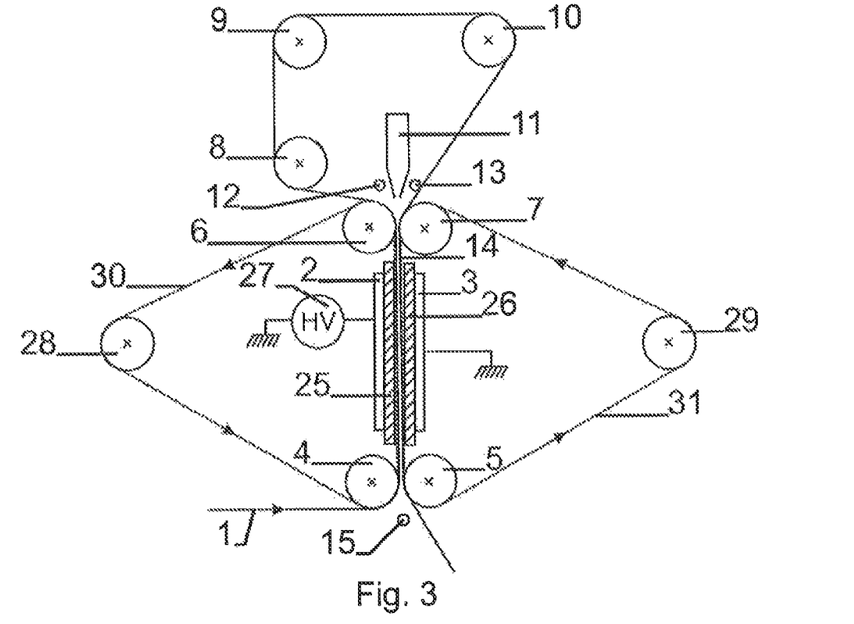
FIG. 3 is a sectional view of the web path and the electrode section in the atmospheric pressure plasma treatment apparatus according to an embodiment of the present invention in which a dielectric belt is guided between the web material and the electrodes.

So-called "Dielectric Barrier Discharge" (DBD) plasma is an embodiment of a non-thermal plasma in which the plasma is produced between two electrodes in close proximity upon applying a voltage such as a high voltage between the two electrodes, if at least one of the electrodes is provided with a dielectric covering for example as a surface layer or as foil, web or belt in close proximity thereto. The DBD plasma can be a glow discharge or a filamentary discharge, a filamentary discharge being preferred in the present invention. FIG. 3 shows a combination of a dielectric layer at the discharge surface of each electrode and a dielectric belt in close proximity to the discharge surface providing the dielectric covering. Dielectric barrier discharge offers interesting perspectives for cost effective in-line plasma treatments of web materials.

The term "plasma treatment process", as used in disclosing the present invention, includes a process in which the surface is modified by a plasma e.g. is functionalised or chemically grafted, a process in which a coating is provided on a surface by a plasma without otherwise modifying the surface and a process in which modification of the surface occurs and a coating is provided on the modified surface.

Near atmospheric pressure, as used in disclosing the present invention, means a pressure in the range of 20 kPa to 110 kPa, with a pressure in the range of 93 kPa to 104 kPa being preferred.

The expression "transportation of a web material by at least two endless dielectric belts", as used in disclosing the present invention, means that a web material is transported by means of contact of one side of the web material with that side of each of at least two endless belts of which no part faces an electrode of the at least one pair of electrodes. Moreover, for those surfaces of the endless dielectric belts in contact with the web material there is a width of at least about 5 mm of the surface not in contact with the web material on either side of the web material.

The term "dielectric covering of an electrode", as used in disclosing the present invention, means not only dielectric material at the surface of the electrode e.g. as a dielectric layer, but also dielectric materials in contact with the surface of the electrode, which may be itself a dielectric layer or a conductive surface e.g. a metallic surface. Such dielectric materials could, for example, be a dielectric belt in frictional contact with the surface of the electrode.

The term high voltage, as used in disclosing the present invention, for alternating current means a voltage greater than 1000 V, preferably greater than 5000 V, particularly preferably greater than 10,000 V and especially preferably greater than 20,000 V; and for direct current means a voltage greater than 1500 V, preferably greater than 5000 V, particularly preferably greater than 10,000 V and especially preferably greater than 20,000 V. The maximum voltage in the case of an alternating current is 200 kV. The maximum voltage in the case of a direct current is also 200 kV. Typically the high voltage used in the present invention will be less than or equal to 150 kV for frequencies in the range of 1.5 kHz up to 15 kHz, will be less than or equal to 80 kV for frequencies above 15 kHz up to 40 kHz and will be less than or equal to 40 kV for frequencies above 40 kHz.

The term "substantially parallel", as used in disclosing the present invention, means no deviating by more than 10% from being parallel, preferably less than 5%.

The term "substantially flat", as used in disclosing the present invention, means having no undulations or curvature.

The term "substantially centrally", as used in disclosing the present invention, means that the centre line of the web material deviates from the centre line of the endless dielectric belt by no more than 5 mm.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Continuous Plasma Treatment Process

In the invention according to the first aspect of the present invention, the continuous plasma treatment process comprises the introduction of a web material into a plasma discharge chamber twice successively, in order to have a double treatment of the atmospheric pressure plasma process and in such a way that the controlled atmosphere in the plasma discharge chamber is confined at both sides by the substrate web and is not in direct contact with the discharge surface of the first electrode and the second electrode, or with the surface of the dielectric coating or layer covering these electrodes. The turbulent flow surprisingly results in a faster treatment rate.

According to a preferred embodiment of the first aspect of the present invention, a continuous plasma treatment process is provided, said process comprising the steps of: producing a non-thermal plasma at a pressure of 100 Pa to 1 MPa in a process gas provided between at least one pair of electrodes, wherein each electrode in said pair is covered by an endless dielectric belt, by applying a voltage to said electrodes thereby constituting a plasma treatment zone; providing a web material to be coated such that it can be transported by said two endless dielectric belts such that there is at least a width of about 5 mm of exposed belt either side of said web material; transporting said web material using said endless dielectric belts in frictional contact with said electrodes such that the side of said web material not in contact with said endless dielectric belts is treated in two passes through said plasma treatment zone together with any part of the endless dielectric belts on the same side as the web material not covered by said web material; and cleaning said parts of said endless dielectric belts treated with said plasma using a cleaning station outside said plasma treatment zone prior to said endless dielectric belts re-entering said plasma treatment zone, wherein said electrodes have a length in the transport direction of said endless dielectric belts of at least 10 mm.

According to a preferred embodiment of the first aspect of the present invention the web material is transported such that it traverses the plasma treatment zone in opposite directions.

According to a preferred embodiment of the first aspect of the present invention, a treatment is realised comprising an inorganic-organic hybrid polymer obtained and/or obtainable from an aerosol containing cross-linked inorganic-organic hybrid pre-polymer, formed via sol-gel processing.

According to a preferred embodiment of the first aspect of the present invention, treatment is provided in which a polymer is deposited and/or grafted to said web material from an organic aerosol.

According to a further preferred embodiment of the first aspect of the present invention a treatment is realised which is obtained by mixing separately in addition to the aerosol one or more additional aerosols, powders, vapours or gases to the plasma discharge, with preferred gases or vapours including: air, Ar, He, $O_2$, $N_2$, $CO_2$, CO, $SF_6$, NO, $NO_2$, $N_2O$, $H_2$, methane, ethane, propane, butane, ethylene, propylene, ethylene oxide, propylene oxide, acetylene, $CF_4$, $C_2F_6$, $C_2F_4$, $H_2O$.

According to a further preferred embodiment of the first aspect of the present invention a treatment is realised with a plasma forming gas selected from the group comprising or consisting of: air, Ar, He, $O_2$, $N_2$, $CO_2$, CO, $SF_6$, NO, $NO_2$, $N_2O$, $H_2$, methane, ethane, propane, butane, acetylene, ethylene, propylene, ethylene oxide, propylene oxide, acetylene, $CF_4$, $C_2F_6$, $C_2F_4$ and mixtures thereof. An aerosol can be added to the plasma-forming gas, this aerosol can be any organic or hybrid organic-inorganic liquid chemical for example any liquid chemical preferably containing one of the following chemical functions: carboxyl, amine, hydroxyl, amide, imide, nitrile, diimide, isocyanide, carbonate, carbonyl, peroxide, hydro peroxide, imine, azide, ether and ester groups, Typical examples are 3-aminopropyltriethoxysilane, acetic acid, acrylic acid, hydroxyethylacrylate, allylacrylate, allylamine, ethylacrylate.

According to another preferred embodiment of the first aspect of the present invention said process increases, decreases and/or controls one or more of the following physical properties compared to the untreated substrate: hydrophilic, hydrophobic, oleophilic, oleophobic, adhesive, release, gas diffusion barrier, liquid diffusion barrier, solids diffusion barrier, chemical resistance, UV resistance, thermal resistance, flame retardancy, porosity, conductivity, optical, self cleaning, acoustic, roughness, wear resistance, scratch resistance, lubricating, antimicrobial, biocompatible, sensory, catalytic properties, humidity, drug release, softness to touch, taste, smell, insect repelling properties, allergic reaction, toxicity, acid-base level.

According to another preferred embodiment of the first aspect of the present invention the temperature of the plasma is regulated at a temperature higher than the temperature at which the controlled atmosphere gives a saturated vapour pressure at its concentration.

According to another preferred embodiment of the first aspect of the present invention the consumption of process gas is in the range of 0.6 to 12 L/m², with 1.2 to 6 L/m² being preferred. For a 40 cm wide electrode and a web speed of 20 m/min a flow rate of 5 to 100 L/min is preferred, with a flow rate of 10 to 50 L/min being particularly preferred.

According to another preferred embodiment of the first aspect of the present invention the process gas upon injection has a temperature of 50 to 400° C. This means that the process gas has been preheated before being injected into the plasma treatment zone.

According to another preferred embodiment of the first aspect of the present invention the plasma has a temperature in the range of 25° C. to 300° C.

According to another preferred embodiment of the first aspect of the present invention the temperature of the plasma is regulated at a temperature between 25° C. and 300 ° C.

According to another preferred embodiment of the first aspect of the present invention the temperature of the plasma is regulated above room temperature and preferably at a temperature above 100° C.

According to another preferred embodiment of the first aspect of the present invention the plasma is maintained at a pressure from about 1000 Pa to about 1 MPa, with a pressure at or near atmospheric pressure being preferred.

According to another preferred embodiment of the first aspect of the present invention the separation between the two electrodes of the electrode pair is between 0.1 and 30 mm, with 0.2 to 20 mm being preferred, with 0.3 to 10 mm being particularly preferred, 0.35 mm to 5 mm being especially preferred and 0.5 to 2.0 mm being especially particularly preferred.

According to another preferred embodiment of the first aspect of the present invention the boundary layer of air on the surface of said web material is removed with a gas knife 32, 33 before entering the discharge chamber.

According to another preferred embodiment of the first aspect of the present invention, the linear velocity of the web material is in the range of about 1.5 cm/s to about 2500 cm/s, with the range of about 5 cm/s to about 670 cm/s being particularly preferred and the range of about 10 cm/s to about 250 cm/s being especially preferred.

Electrodes

The electrodes comprise or consist of an electrically conducting material, for example a metal such as stainless steel or aluminium optionally having a dielectric layer at the discharge surface. The discharge surface of the electrodes each in frictional contact with an endless dielectric belt has to be highly smooth and have a surface energy to minimise the friction between the back-side of the endless dielectric belt and the discharge surface of the electrode. The surface energy of the discharge surface of the electrodes is preferably less than 35 mN/m, with less than 31 mN/m being particularly preferred.

According to a preferred embodiment of the first and second aspects of the present invention the at least one pair of electrodes are substantially parallel plate electrodes with these parallel plate electrodes being preferably substantially flat.

According to another preferred embodiment of the first and second aspects of the present invention two of the pairs of electrodes share a common electrode e.g. an earthed (grounded) electrode.

According to another preferred embodiment of the first and second aspects of the present invention one or both of the at least one pair of electrodes is segmented in different parts of any shape.

According to another preferred embodiment of the first and second aspects of the present invention one or both of the at least one pair of electrodes comprises a surface layer of solid dielectric material at said discharge surface 25, 26, 125, 126, 225, 226, the surface layer of solid dielectric material preferably having the same dimensions as the underlying electrically conducting material or larger dimensions than the underlying electrically conducting material with larger dimensions in the transport direction of the endless dielectric belts being particularly preferred, as shown in FIGS. 2-6. Protrusion of the surface layer of solid dielectric material is preferably at both ends of the electrode in the transport direction of the endless dielectric belts.

According to another preferred embodiment of the first and second aspects of the present invention one or both of the at least one pair of electrodes has a length in the transport direction of the web material of between 10 mm and 500 mm, with 50 to 300 mm being preferred and 70 to 150 mm being particularly preferred.

According to another preferred embodiment of the second aspect of the present invention the temperature of one or both of the at least one pair of electrodes is regulatable.

According to another preferred embodiment of the first aspect of the present invention one or both of the at least one pair of electrodes has a regulated temperature above room temperature.

According to another preferred embodiment of the first and second aspects of the present invention the at least one pair of electrodes is present as a parallel and/or serial combination.

According to another preferred embodiment of the first and second aspects of the present invention one or both of the at least one pair of electrodes is movable.

According to another preferred embodiment of the first and second aspects of the present invention the at least one pair of electrodes has a dimension perpendicular to the transport direction of the dielectric belts of at least 2 cm, with at least 10 cm being preferred.

According to another preferred embodiment of the first and second aspects of the present invention the at least one pair of electrodes has a dimension perpendicular to the transport direction of the dielectric belts of at most 100 cm, with at most 60 cm being preferred.

According to another preferred embodiment of the first and second aspects of the present invention the at least one pair of electrodes has a ratio of the length in the transport direction of the dielectric belts to the dimension perpendicular to the transport direction of the dielectric belts of at least 3, with at least 5 being preferred and with at least 10 being particularly preferred.

According to another preferred embodiment of the first and second aspects of the present invention the at least one pair of electrodes has a ratio of the dimension perpendicular to the transport direction of the dielectric belts to the length in the transport direction of the dielectric belts of at least 3, with at least 5 being preferred and with at least 10 being particularly preferred.

Endless Dielectric Belts

Endless dielectric belts serve multiple purposes: they convey the web material being treated and protect the side of the web material in contact with the dielectric belt, the so-called "back-side", from plasma treatment, but they also provide at least part or the dielectric covering of an electrode and in the case of an electrode without a dielectric layer at the discharge surface all the dielectric covering. The endless belts used in the present invention are typically 0.1 to 10 mm thick.

According to a preferred embodiment of the first and second aspects of the present invention, the at least one pair of endless dielectric belts is seamless.

In another preferred embodiment of the first and second aspects of the present invention the endless dielectric belt comprises one or more of a rubber (e.g. chloroprene rubber, fluorine-based rubber, silicone rubber); a plastic; non-woven or woven fibres; natural, synthetic or semi-synthetic fibres; inorganic fibres (e.g. glass fibres); and cellulosic material, with reinforced or non-reinforced silicone rubber or Teflon® being preferred.

Dielectric Materials for the Covering of the Electrodes

The dielectric covering typically is in the form of sheets or films, with a preferred thickness from 0.01 to 10 mm and a particularly preferred thickness of 1.5 to 5 mm, but other shapes may also be used. Too thick solid dielectric coverings require too high voltages to generate a plasma, whereas too low thicknesses can cause arc discharges due to dielectric breakdown. It is important that at least part of the dielectric covering has dimensions such that no arcing to the conductive part of the electrode can take place.

According to a preferred embodiment of the first and second aspects of the present invention, the variation in dielectric layer thickness is no more than 5%, with no more than 3% being preferred, no more than 1% being particularly preferred and no more than 0.1% being especially preferred depending on the typical plasma parameters used such as power, frequency, reactive gas composition and plasma discharge gap (mm).

According to a preferred embodiment of the first and second aspects of the present invention, the effective gap between the electrodes i.e. the gap between the outermost dielectric covering of one electrode and the outermost dielectric covering, if a dielectric covering is present, of the second electrode is in the range between 0.1 and 30 mm, with 0.2 to 10 mm being preferred, 0.35 mm to 5 mm being particularly preferred and 0.5 to 2.0 mm being especially preferred.

According to a preferred embodiment of the first and second aspects of the present invention, the dielectric covering has a dielectric constant of at least 1, with at least 2 being preferred, to generate stable high density discharge plasma, with dielectric layers with a dielectric constant of at least 10 being preferred. An upper limit for the dielectric constant is not specifically known.

Typical materials with a dielectric constant of not less than 1 used for such dielectric coverings are plastics such as poly (tetrafluoroethylene) and poly(ethylene terephthalate); glass; metal oxides such as silicon dioxide, aluminum oxide, zirconium dioxide and titanium dioxide; complex oxides such as barium titanate; mica and multilayered materials thereof.

In a preferred embodiment of the first and second aspects of the present invention, the electrode surface in frictional contact with the dielectric belt is a dielectric layer, the dielectric barrier in the dielectric barrier discharge plasma process then comprising the dielectric layer at the surface of the electrode, air between the dielectric layer and the dielectric belt. The dielectric layer can be an organic polymer or an inorganic glass layer for example mica, silicate glass, borate glass, phosphate glass, germinate glass, tellurite glass, aluminate glass and vanadate glass, with borate glass being particularly preferred.

Web Material

The web material transported by the endless dielectric belts can be any flexible, non-conducting web material, which can be transported by the endless dielectric belts, can be treated e.g. polymers film or foams. The web material is preferably centrally placed on the endless dielectric belts such that at least a width of dielectric belt of 5 mm is left on either side of the material web. The thickness of the web material is preferably in the range of 10 µm to 2000 µm, with 50 to 1000 µm being preferred and 70 to 250 µm being particularly preferred.

According to a preferred embodiment of the first and second aspects of the present invention the web material is selected from one or more of a plastic, non-woven or woven fibres, natural, synthetic or semi-synthetic fibres, a cellulosic material, a metal, a ceramic, a powder and any composite structure thereof.

Examples of plastic web materials are a polyolefin film e.g. a polyethylene film, a polypropylene film, a polymethylpentene film, a polyolefin copolymer film and a cyclic polyolefin film; a polystyrene film e.g. an atactic or syndiotactic polystyrene film; a film of polystyrene derivatives; a polycarbonate film; a polyester film, such as a polyethylene terephthalate, polybutylene terephthalate, polyethylene naphthalate or 1,2-dimethylenecyclohexylene terephthalate film; a copolyester film; a film of an acrylic resin e.g. a polymethyl methacrylate film; a film of polyvinyl chloride or of copolymers of vinyl chloride; a polyamide film e.g. a nylon film; a polysulfone film; a polyethersulfone film; a fluorine-containing resin film such as a film of poly(vinylidene fluoride) or copolymers of vinylidene fluoride; polytetrafluoroethylene and copolymers of tetrafluoroethylene; a film of polyvinylidene chloride or copolymers of vinylidene chloride; a film of a cellulose ester such as cellulose diacetate, cellulose acetate butyrate, cellulose acetate propionate, cellulose acetate phthalate, cellulose triacetate, cellulose nitrate or their derivatives; a cellophane film, a polylactic acid film, a polycaprolactone film, a polycaprolactam film, a film of polyvinyl alcohol or a copolymer of vinyl alcohol e.g. an ethylene-vinyl alcohol film; a norbornene resin film; a polyetherketone film; a film of polyimide or a copolymer of an imide e.g. a polyetherketone-imide film; and a polyarylate film.

Process Gas

The "process gas", either produces a plasma upon subjection to the dielectric barrier discharge or is injected into a pre-existing dielectric barrier discharge plasma. In a continuous process the "process gas" is fed continuously into the plasma in the plasma treatment zone.

According to a preferred embodiment of the first aspect of the present invention the process gas comprises a reactive and/or an inert gas.

According to a preferred embodiment of the first aspect of the present invention the process gas comprises at least 80 volume % of nitrogen, with the balance made up of active components, with at least 90 volume % of nitrogen being preferred, at least 95 volume % of nitrogen being preferred and at least 97 volume % of nitrogen being especially preferred.

According to a preferred embodiment of the first aspect of the present invention the process gas comprises less than 200 ppm of oxygen, with less than 100 ppm of oxygen being preferred.

The active component of the process gas may be various organic, inorganic or hybrid (organic/inorganic) precursors. If not gaseous, these precursors are generally provided in the form of vapours of (heated) liquids, aerosols or as (nano sized) particles. When chemical compounds are introduced into a plasma discharge, chemically active species are formed such as molecules in excited states, radicals and ions. These species can react with each other, with neutral molecules or with the surface of a substrate. Depending on the nature of the compounds and the process conditions, this may result in cleaning, etching, chemical surface modification (often referred to as activation), deposition of a thin film (often referred to as plasma assisted coating deposition) or the formation of new chemical compounds in the form of gases, liquids or (nano sized) powders.

According to another preferred embodiment of the first aspect of the present invention the process gas comprises a reactive gas selected from the group comprising or consisting of nitrogen, oxygen, ozone, hydrogen peroxide, carbon dioxide, carbon monoxide, hydrogen, water vapour, nitrogen oxides, ammonia, fluorinated hydrocarbons, $SF_6$, alkanes, alkenes, alkynes, alkylene oxides and mixtures of two or more of these gases.

According to another preferred embodiment of the first aspect of the present invention the process gas comprises an inert gas selected from the group comprising or consisting of helium, neon or argon, krypton and xenon.

According to another preferred embodiment of the first aspect of the present invention the process gas comprises gases, vapours, aerosols or powders of non cross-linked precursor chemicals.

According to another preferred embodiment of the first aspect of the present invention the process gas comprises a pre-polymer mixture.

According to another preferred embodiment of the first aspect of the present invention the process gas comprises an aerosol containing hybrid organic/inorganic cross-linked pre-polymers.

According to another preferred embodiment of the first aspect of the present invention the process gas comprises an aerosol comprising hybrid organic/inorganic cross-linked pre-polymers. Such a mixture may exhibit a compositional gradient in the process gas and/or give a compositional gradient in the plasma upon injection in the plasma treatment zone.

According to another preferred embodiment of the first aspect of the present invention the process gas comprises a pre-polymer mixture comprising inorganic-coating forming materials, said inorganic-coating forming materials being preferably selected from the group comprising or consisting of colloidal metals, metal oxides and organometallic compounds; and/or organic coating forming materials including oligomers. Preferred organometallics compounds contain metals such as Ti, Zr, Sn, Si or Zn, with compounds selected from the group comprising or consisting of organosilanes e.g. alkylsilanes and alkoxysilanes, tin compounds e.g. alkoxytin compounds, tetraalkoxyzirconium compounds, tetraalkoxytitanium compounds and trialkoxyaluminium compounds being particularly preferred. Preferred organic coating forming materials are selected from carboxylates e.g. (meth)acrylates including fluorinated, hydroxy, amino, and silyl derivatives thereof; styrene; styrene derivatives; (meth)acrylonitriles; alkenes such as ethylene, propylene and allyl compounds; dienes such as butadienes; alkynes; (meth)acrylic acid; fumaric acid; fumaric acid esters; itaconic acid; itaconic acid esters; maleic anhydride; halogenated alkenes e.g. fluorinated or chlorinated alkenes such as vinyl halides, vinylidene halides; ally amine; (meth)acrylamide; epoxy compounds; styrene oxide; butadiene monoxide; ethyleneglycol diglycidylether, glycidyl methacrylate, bisphenol A diglycidylether (and its oligomers); vinylcyclohexene oxide; phosphorus-containing compounds e.g. dimethyldiallylphosphonate; heterocyclic compounds such as pyrrole, pyrrole derivatives, furan, furan derivatives, thiophene and thiophene derivatives; and any mixtures thereof. Multifunctional polymerizable compounds may be added to the precursor to increase the cross-linking density thereby enhancing the stability of the coating e.g. multifunctional acrylates such as 1,6-hexanediol diacrylate, penterthrito penta/hexa-acrylate and trimethylolpropane ethoxylate triacrylate.

According to another preferred embodiment of the first aspect of the present invention said treatment is applied as a liquid precursor.

High Voltage Source

Any generator capable of delivering a high voltage having a symmetrical or asymmetrical profile may be used as the high voltage source. Suitable generators are, for example, generators supplied by AFS and Corona Designs.

According to preferred embodiment of the first aspect of the present invention at least one alternating voltage or pulsed DC voltage is applied between the two electrodes of the at least one electrode pair at a frequency from about 1 Hz to about 100 MHz, with about 1 kHz to about 100 kHz being preferred.

According to another preferred embodiment of the first aspect of the present invention two alternating voltage or pulsed DC voltages are applied between the two electrodes of the at least one electrode pair.

According to another preferred embodiment of the first aspect of the present invention a high frequency alternating voltage or pulsed DC voltage is applied between the two electrodes of the at least one electrode pair at an output of not more than 10 W/cm$^2$, with not more than 5 W/cm$^2$ being preferred.

According to another preferred embodiment of the first aspect of the present invention an alternating voltage or a pulse DC voltage is applied between the two electrodes of the at least one electrode pair to provide an electric field of 1 to 1000 kV/cm, with an electric field strength of 10 to 700 kV/cm being preferred.

According to another preferred embodiment of the first aspect of the present invention a voltage is applied to one of the electrodes of the at least one electrode pair and the other electrode of the electrode pair is earthed.

Cleaning of the Endless Dielectric Belts

During the passage of the endless dielectric belts through the plasma zone the endless dielectric belts are subject to plasma-related contamination, which upon transportation of the endless dielectric belts outside the plasma zone is continuously removed in a cleaning station outside the plasma treatment zone.

The method used for removing this plasma-related contamination is dependent upon the composition of the plasma and can be accomplished with direct contact system or non-contact systems. A contact system could comprise one or more blades, wipers or brushes or combinations thereof. Non-contact systems could be steam (or solvent) cleaning devices, blow cleaning devices or static load cleaning devices. Steam or solvent-cleaning can be used to dissolve the contamination and thereby remove it. Blow and static load cleaning devices are often used to dust clean endless dielectric belts.

A further option is the use of plasma cleaning, which means the use of an oxidising plasma (direct or remote) thereby "burning" away the surface of the treatment.

The system used will depend upon the nature of the treatment and in many cases a combination of several cleaning solutions will be required.

Apparatus

The configuration of a non-thermal plasma apparatus, according to the present invention, e.g. a DBD apparatus, generally comprises one or more sets of two electrodes of which at least one is covered with an insulating (dielectric) material.

According to a preferred embodiment of the second aspect, according to the present invention, An apparatus is proved comprising: two endless dielectric belts each having a first and a second side; at least one pair of electrodes; a voltage power supply connected to said pair of electrodes such that a non-thermal plasma can be produced upon applying said voltage to said electrode pair in a process gas in the space between the endless dielectric belt-covered electrodes; each of said electrodes having a discharge surface and said discharge surface being in contact with a first side of said endless dielectric belts thereby shielding said discharge surfaces and the respective sides of the endless dielectric belts in contact with said electrodes from products of said non-thermal plasma; a means of transporting a web material to be coated comprising said endless dielectric belts; a process gas supply; rollers for driving/guiding said endless dielectric belts; and a cleaning station capable of cleaning products of said plasma deposited on the second sides of said endless dielectric belts therefrom.

Figure 1:
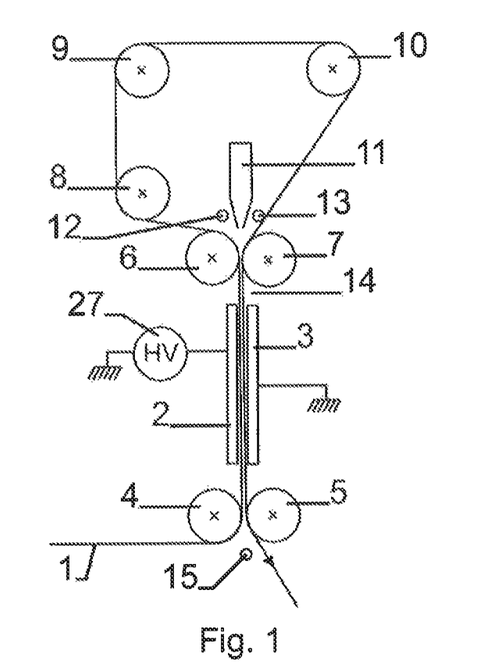
FIG. 1 is a sectional view of the web path and the electrode section in the atmospheric pressure plasma treatment apparatus in which the web is exposed twice to the plasma process where the second passage has the opposite direction to the first passage, but there is no dielectric covering between the electrically conducting material of the electrodes and the web material.
Figure 2:
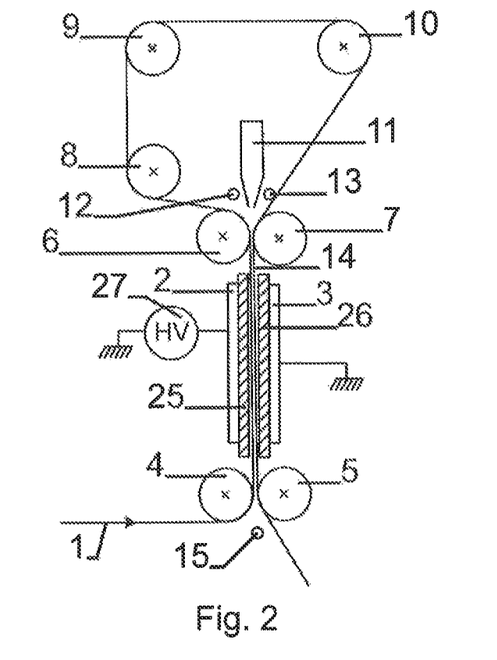
FIG. 2 is the same sectional view as FIG. 1, but with a dielectric covering between the electrically conducting material of the electrodes and the web material in the form of the electrodes having a surface dielectric layer over the electrically conducting material.

FIG. 1 shows an arrangement in which web 1 is guided by rollers 4 and 6 in the discharge chamber 14 between electrodes 2 and 3. Rollers 7, 8, 9 and 10 guide web 1 back into the discharge chamber 14, such that the same surface of the web is exposed to the plasma process in the discharge chamber 14 for the second time and such that the upper nip zone, defined by rollers 6 and 7 is accessible by a dispenser 11 and supply tubes 12 and 13. The controlled atmosphere is arranged by this dispenser 11 and supply tubes 12 and 13 by injecting the reactive gas and/or aerosol and into discharge chamber 14. Exhaust of the controlled atmosphere is arranged by exhaust tube 15. FIG. 2 shows a refinement of the arrangement in FIG. 1 in which the electrodes each comprise a surface dielectric layer enabling a dielectric barrier discharge to be realised.

FIG. 3 shows an embodiment of the second aspect of the present invention in which an endless dielectric belt conveying a web material is guided over each of the electrodes with the dielectric belt being between the electrodes and the web material. One dielectric belt is guided directly over guiding rollers 4 and 6 and the other over guiding rollers 5 and 7 together in each case with the web material by virtue of its being conveyed by the dielectric belts. Each endless dielectric belt moves at the same speed as the web material and is in close contact with the back side of the web material by the action of electrostatic attraction forces between the electrostatic belt and the web material. The dielectric belt thereby protects the back-side of the web material from being scratched or damaged by frictional contact with the outer surface of the electrode, which may be an outermost dielectric layer, and also from unwanted and uncontrolled plasma treatment. This unwanted and uncontrolled plasma treatment occurs if an endless dielectric belt is not used to convey the web material, because than the back-side of the web material is in frictional contact with the outer electrode surface and consequently occasional gaps filled with an uncontrolled mixture of surrounding air and plasma atmosphere are created.

Figure 4:
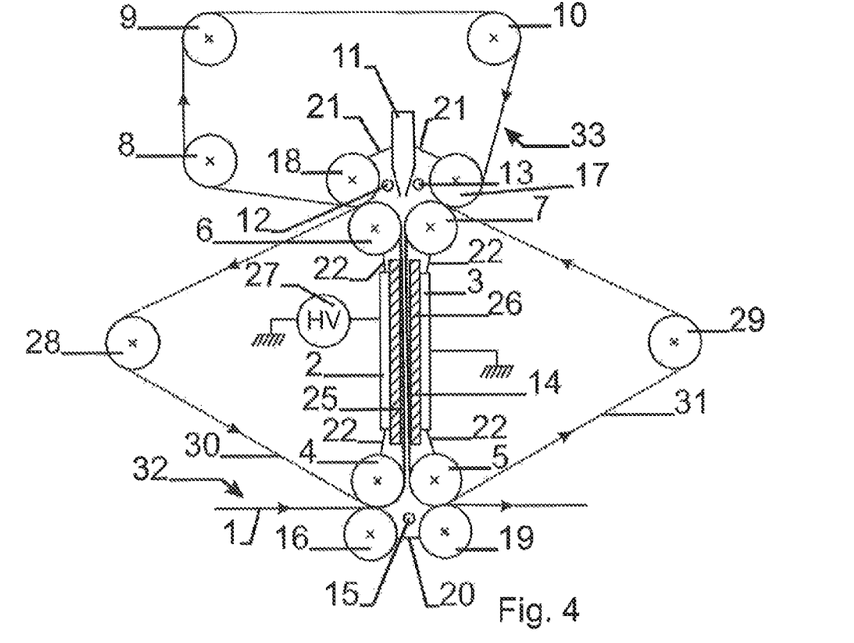
FIG. 4 is a sectional view of the web path and the electrode section in the atmospheric pressure plasma treatment apparatus according to another embodiment of the present invention in which the feed and exit sides of the discharge chamber are confined by confining seals [20] and [21] and confining rollers [16-19].

To reduce or eliminate loss of the process gas, and to achieve a more consistent and homogenous plasma treatment, the zone immediately adjacent to the plasma treatment zone needs to be reduced in size i.e. confined. This is shown in FIG. 4 in which this confinement is realised with discharge confining rollers (16) to (19) and discharge confining seals (20), (21) and (22). Ambient air surrounding the plasma treatment zone also needs to be excluded from entering into the plasma discharge zone. Unwanted intrusion of air may influence the plasma chemistry (for example by forming ozone) and the plasma discharge characteristics (e.g. formation of streamers and other inhomogeneities on the surface of the web material being treated). In particular the boundary layer of air at the surface of the web material (typically in a laminar state) has to be excluded from entering the plasma treatment zone as the web material is fed into the plasma treatment zone e.g. with a seal or the use of a gas knife 32, 33 to remove the boundary layer of air from the surface of the web. The use of a gas knife enables higher line speeds and hence greater throughput and significantly less gas consumption to be realised.

A preferred embodiment of the first and second aspects of the present invention for preventing ambient air from entering the plasma treatment zone and reducing the loss of process gas is shown in FIG. 4 in which the entrance and exit sides of the plasma treatment zone are confined by discharge confining rollers 16, 17, 18 and 19 with the web material being treated. Gas knifes 32 and 33 are positioned above the surface of the web material before entry into the plasma treatment zone. The gaps between rollers 17 and 18, and 16 and 19 are sealed with seals 20 and 21. The gaps between rollers 16, 17, 18 and 19 and the electrodes are sealed with seals 22. Typical materials for seals 20, 21 and 22 are poly(tetrafluroethylene), silicone rubber or polyurethane foam seals with a vinyl or polypropylene outer skin. Alternative seals are brushes made of 100% polyester fibres. The lateral ends of the plasma discharge zone 14, in which in some cases ambient air enters the plasma discharge zone, are confined by partially enclosing the ends so that the process chamber is largely confined in all directions.

Figure 5:
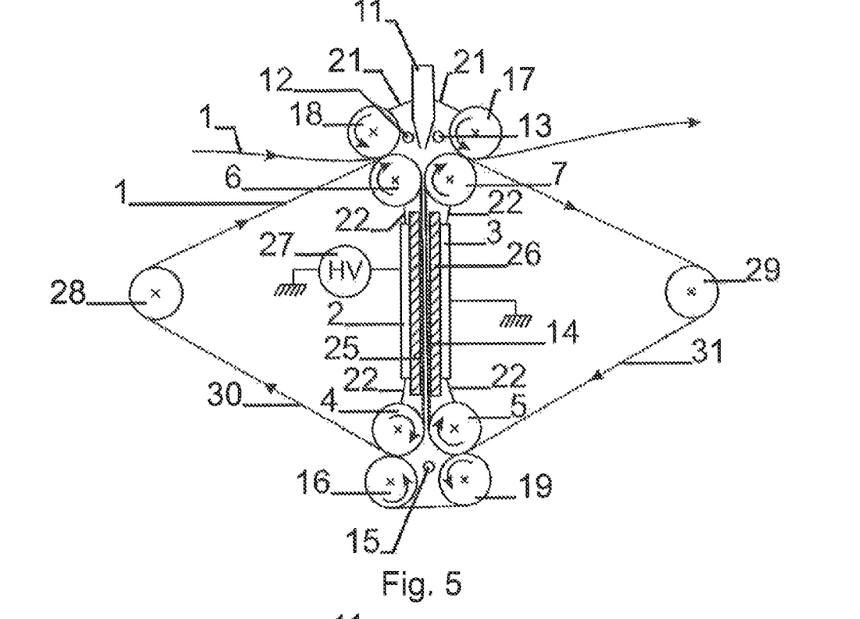
FIG. 5 is a sectional view of the web path and the electrode section in the atmospheric pressure plasma treatment apparatus according to another embodiment of the present invention in which the web is exposed twice to the plasma process where the web entrance and web exit section are exchanged compared with FIGS. 3 and 4.

FIG. 5 shows another simplified embodiment of the second aspect of the present invention in which the web material is guided in two passes through a plasma treatment zone, in which the side at which the web material enters for the first time is the same as that in which the process gas is supplied and in which discharge confining rollers 16, 17, 18 and 19 are used to guide the web material for the second pass through the plasma discharge zone 14.

Figure 6:
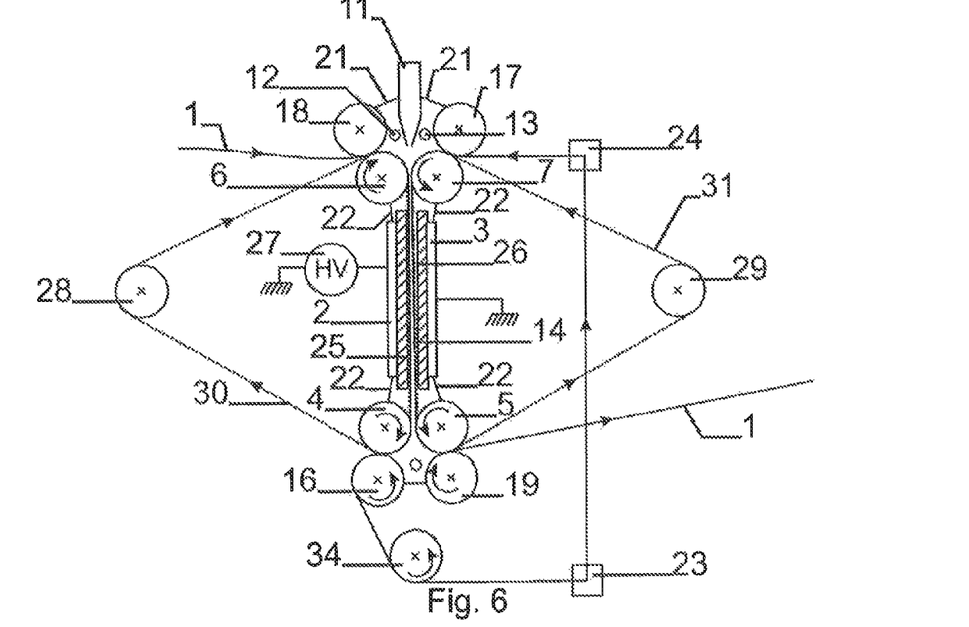
FIG. 6 is a sectional view of the web path and the electrode section in the atmospheric pressure plasma treatment apparatus according to another embodiment of the present invention in which the web is exposed twice to the plasma process where the web movement directions during both passages are the same.

FIG. 6 shows another embodiment of the second aspect of the present invention in which the web material is guided to make two passes through the plasma treatment zone each in the same direction. This allows for a laminar flow of gasses in the discharge chamber during the plasma treatment and requires that the web material be guided twice over turner bars and roller systems 23 and 24 after leaving the plasma discharge chamber 14 after the first pass, before being guided back into the discharge chamber for the second pass. Turning bar and roller systems are well known to those skilled in the art of web guiding systems and allow for the same web material side to be exposed to the plasma process as during the first exposure while the web material is moving in the same direction through the plasma discharge zone as during the first pass.

Figure 7:
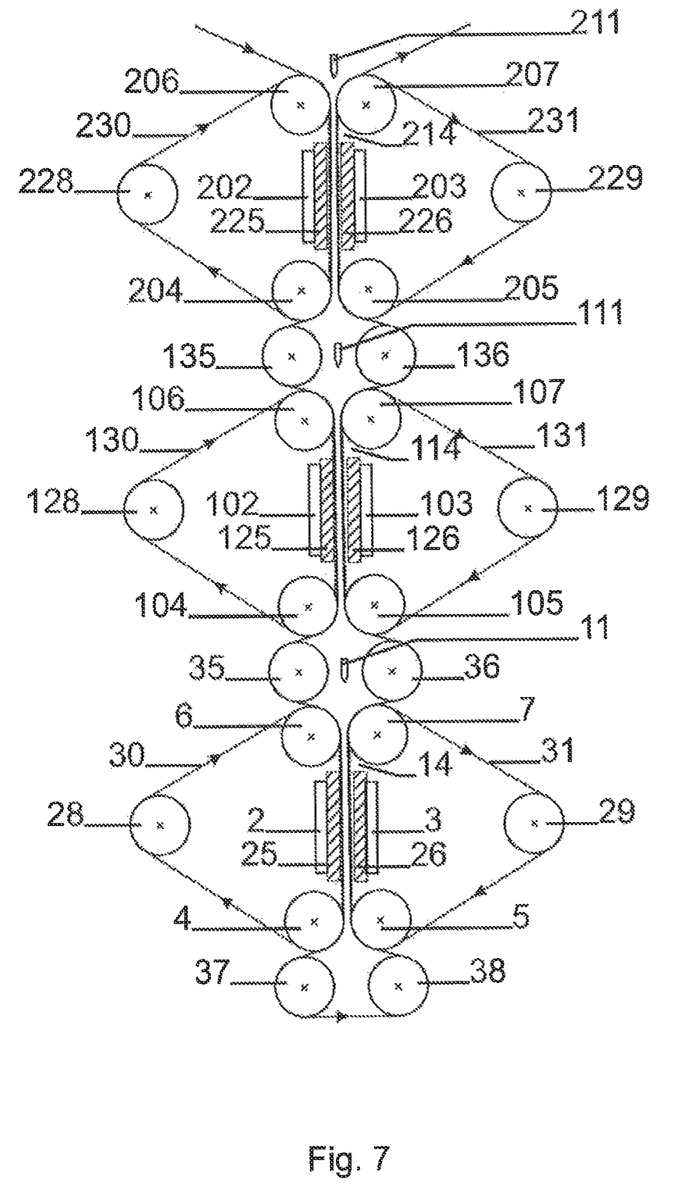
FIGS. 7, 8 and 9 are sectional views of the web path and the electrode section in the atmospheric pressure plasma treatment apparatus according to another embodiment of the present invention in which several plasma stations are combined to have multiple plasma exposures of the web material.
Figure 8:
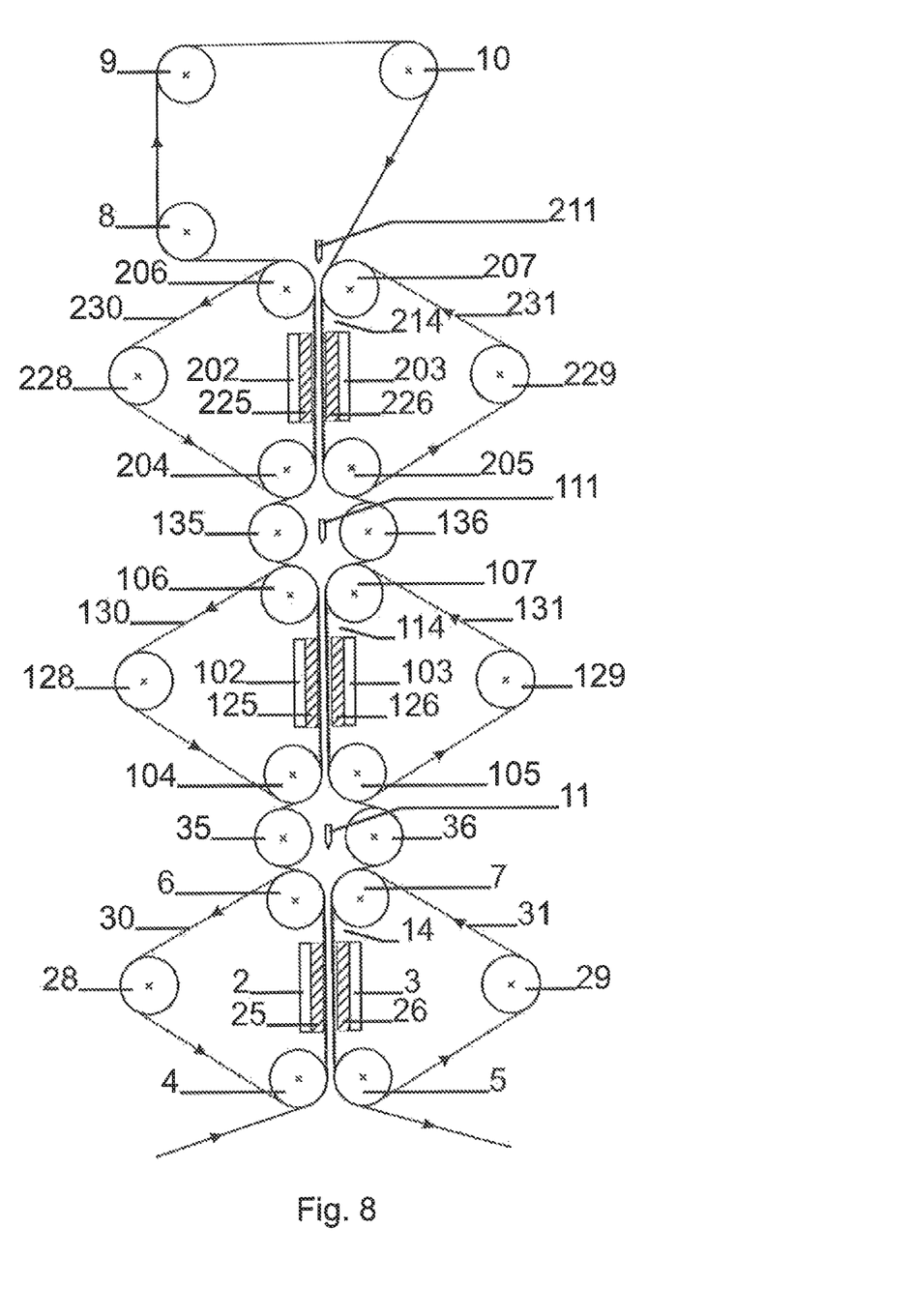
Figure 9:
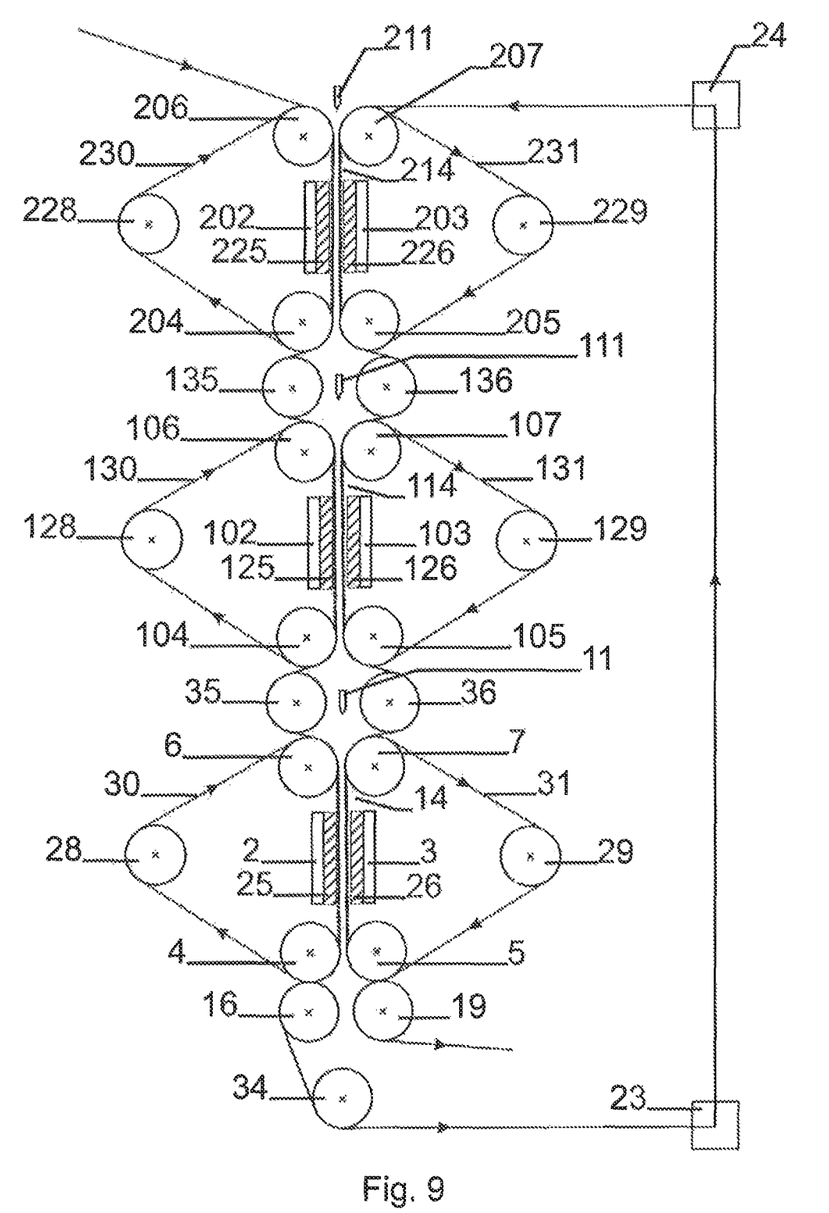

FIGS. 7, 8 and 9 show other embodiments of the second aspect of the present invention in which the web material is guided several times successively through multiple plasma stations with discharge chambers 14, 114 and 214, using combinations of embodiments as presented above.

According to a preferred embodiment of the first and second aspects of the present invention the entrance and exit sides of said discharge chambers are confined by contact of rollers against the surface of the web material with the remaining gaps between said discharge chambers and the surrounding atmosphere being preferably confined by static seals.

Applications

The present process enables the realisation of polar film-functionalisation, nano-coatings, release coatings and anti-bacterial coatings on web materials with thicknesses of from 1 to 20 nm up to 100 nm with extended apparatus lifetime.

Thus, there has been disclosed an apparatus and method for the plasma treatment of moving webs. It will be readily apparent to those skilled in this art that various changes and modifications of an obvious nature may be made, and all such changes and modifications are considered to fall within the scope of the present invention, as defined by the appended claims.

The invention claimed is:

1. An apparatus comprising:
at least one plasma treatment zone, each of said at least one plasma treatment zone comprising a pair of electrodes, each electrode of said pair of electrodes with a respective endless dielectric belt covering the electrode, each respective endless dielectric belt having a first and a second side;
a voltage power supply for each of said at least one plasma treatment zone connected to said pair of electrodes such that a non-thermal plasma can be produced upon applying a voltage to said pair of electrodes in a process gas in a space between each electrode of said pair of electrodes covered with the respective endless dielectric belt;
each electrode of said pair of electrodes in each of said at least one plasma treatment zone having a discharge surface, said discharge surface being in frictional contact with a first side of the respective endless dielectric belt thereby shielding said discharge surface and the first side of the respective endless dielectric belt from products of said non-thermal plasma, wherein the discharge surface in frictional contact with the first side of the respective endless dielectric belt comprises a dielectric layer;
a means of transporting a web material to be treated, said means of transporting the web material to be treated comprising said endless dielectric belts;
a process gas supply;
rollers for guiding said endless dielectric belts; and
a cleaning station capable of cleaning products of a plasma treatment on second sides of said endless dielectric belts therefrom.

2. The apparatus according to claim 1, wherein said dielectric layer is an organic polymer or is an inorganic glass.

3. The apparatus according to claim 1, wherein at least one electrode of said pair of electrodes has a dimension perpendicular to a transport direction of said endless dielectric belts of at least 10 cm.

4. The apparatus according to claim 1, wherein at least one electrode of said pair of electrodes has a dimension perpendicular to a transport direction of the respective endless dielectric belts of at most 60 cm.

5. The apparatus according to claim 1, wherein at least one electrode of said pair of electrodes has a ratio of a length in a transport direction of the respective endless dielectric belt to a dimension perpendicular to the transport direction of at least 5.

6. The apparatus according to claim 1, wherein said means of transporting the web material is adapted to transport said web material such that the web material traverses said non-thermal plasma in multiple passes in a same direction.

7. The apparatus according to claim 1, wherein gas knives are positioned above a surface of said web material before entry into one of said at least one plasma treatment zone.

* * * * *